United States Patent
Thurgate et al.

(10) Patent No.: US 9,466,489 B2
(45) Date of Patent: Oct. 11, 2016

(54) PROCESS FOR FORMING EDGE WORDLINE IMPLANTS ADJACENT EDGE WORDLINES

(71) Applicant: Cypress Semiconductor Corporation, San Jose, CA (US)

(72) Inventors: Tim Thurgate, Sunnyvale, CA (US); Yu Sun, Saratoga, CA (US); Chun Chen, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 69 days.

(21) Appl. No.: 14/108,780

(22) Filed: Dec. 17, 2013

(65) Prior Publication Data

US 2015/0171100 A1   Jun. 18, 2015

(51) Int. Cl.
*H01L 27/115* (2006.01)
*H01L 21/265* (2006.01)
*H01L 29/66* (2006.01)

(52) U.S. Cl.
CPC ..... *H01L 21/26586* (2013.01); *H01L 27/1157* (2013.01); *H01L 29/66833* (2013.01)

(58) Field of Classification Search
None
See application file for complete search history.

(56) References Cited

U.S. PATENT DOCUMENTS

| | | | |
|---|---|---|---|
| 2006/0220098 A1* | 10/2006 | Lee | H01L 27/1052 257/315 |
| 2008/0164509 A1* | 7/2008 | Lee | G11C 16/0483 257/315 |
| 2009/0233412 A1* | 9/2009 | Hemink | H01L 27/115 438/302 |
| 2010/0072560 A1* | 3/2010 | Lee | H01L 21/26586 257/393 |

* cited by examiner

*Primary Examiner* — Khaja Ahmad
(74) *Attorney, Agent, or Firm* — Lowenstein Sandler LLP (57) ABSTRACT

A process for forming tilted edge wordline implants is disclosed. The process includes forming a first drain implant in a substrate, forming a first tilted implant in a substrate adjacent a first edge wordline to supplement said first drain implant where the first tilted implant is provided at a tilt angle from a first direction and forming a second tilted implant in the substrate adjacent a second edge wordline to supplement another first drain implant where the second tilted implant is provided at a tilt angle from a second direction. A second drain implant is formed in the substrate.

18 Claims, 13 Drawing Sheets

PROCESS FOR FORMING EDGE WORDLINE IMPLANTS ADJACENT EDGE WORDLINES

Consumer electronic products such as televisions, digital cameras, cellular telephones, media content players, etc., are designed, manufactured and marketed for the purpose of satisfying the substantial consumer demand for basic communications and entertainment services. Data storage components play an important role in the operation of such devices. Data storage devices can include RAM, ROM, flash memory devices, etc.

Flash memory is non-volatile computer memory that can be electrically erased and reprogrammed. Flash memory is primarily used in memory cards and USB flash drives for general storage and transfer of data between computers and other digital products. Example applications include data storage for PDAs (personal digital assistants), laptop computers, digital audio players, digital cameras and mobile phones. Other applications include game consoles, where flash memory can be used instead of other types of EEPROMs or battery-powered SRAM for game save data.

Flash memory is typically made up of an array of floating gate transistors that form respective memory cells of the array. One or more bits of data can be stored as charge by each of the memory cells. SONOS type flash memory cells include a silicon substrate that includes silicon oxide formed over portions of the silicon substrate, a layer of silicon oxide formed over the silicon portions, a layer of silicon nitride formed on the layer of silicon oxide, an upper layer of silicon oxide formed on the layer of silicon nitride, and a layer of electrically conductive material formed on the upper layer of silicon oxide. The lower silicon oxide layer, the silicon nitride layer and the upper silicon oxide layer (ONO stack) form a charge trapping dielectric structure.

Figure 1:
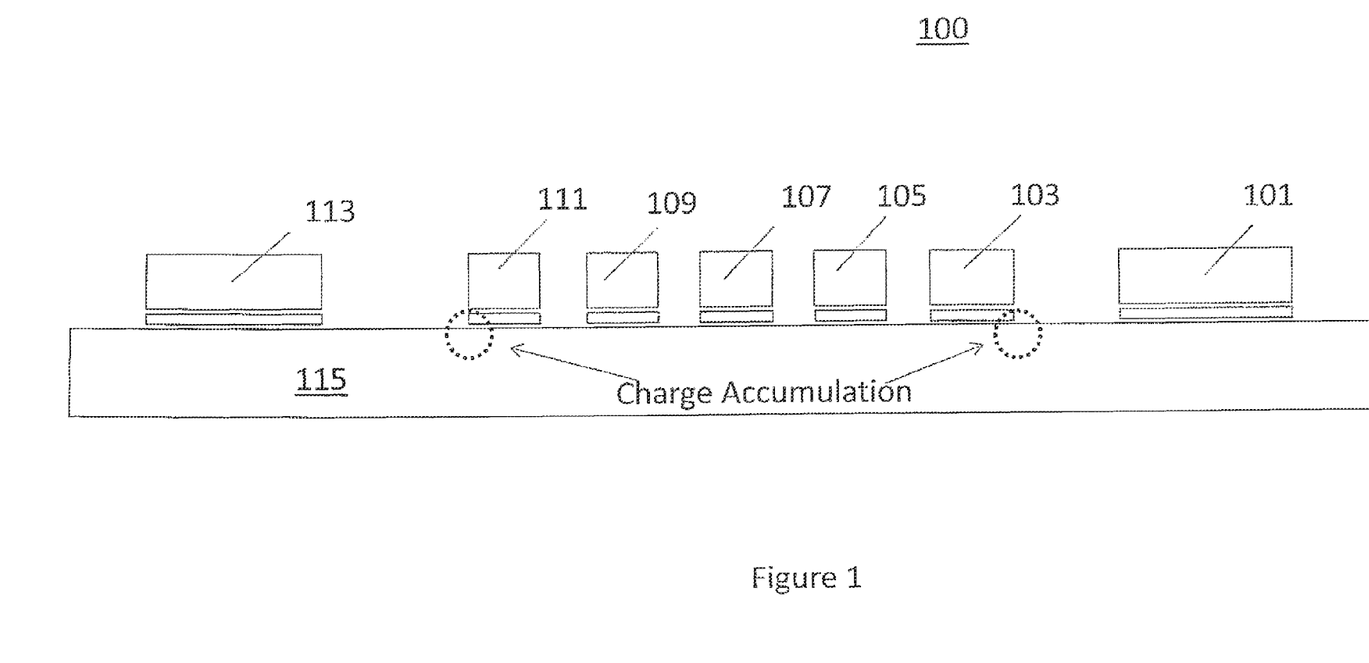
FIG. 1 shows a cross sectional view of a memory cell string of a conventional memory cell array that includes a SONOS structure.

FIG. 1 shows a cross sectional view of a memory cell string 100 such as can be a part of a conventional memory cell array that includes a SONOS structure. Memory cell string 100 includes memory cell selecting devices that comprise select gates 101 and 113, edge memory cells that comprise edge wordlines 103 and 111 and intermediate memory cells that comprise intermediate wordlines 105, 107 and 109. Implants implanted in substrate 115 form source and drain regions of the memory cells and the memory cell selecting devices.

A solid-state-storage program-erase cycle is a sequence of events in which data is written to memory cells (such as the type found in a so-called flash or thumb drive) such as are shown in FIG. 1, then erased, and then rewritten. Program-erase (PE) cycles can serve as a criterion for quantifying the endurance of a flash storage device.

Referring to FIG. 1, a consequence of erase cycling is that electric charge can become trapped in the spaces that are located adjacent edge wordlines 103 and 111. Importantly, the accumulation of electric charge in in such spaces raises the threshold voltage, Vt, of the memory cells that are associated with edge wordlines 103 and 111. The elevated threshold voltage can make it difficult to completely erase the memory cells and reduces the drain-source current, Ids, of the entire memory cell string 100.

SUMMARY

In memory cell strings, erase cycling can trap charge adjacent the edge wordlines of the memory cell strings and make it difficult to completely erase the edge wordlines. In addition, the accumulation of charge can reduce the Ids of an entire memory cell string. A process for forming tilted edge wordline implants without using critical masks that addresses the aforementioned consequences of the accumulation of charge is disclosed. However, the claimed embodiments are not limited to implementations that address any or all of the aforementioned consequences. In one embodiment, the process includes forming a first drain implant in a substrate, forming a first tilted implant in a substrate adjacent a first edge wordline to supplement the first drain implant (where the first tilted implant is provided at a tilt angle from a first direction) and forming a second tilted implant in the substrate adjacent a second edge wordline to supplement the first drain implant (where the second tilted implant is provided at a tilt angle from a second direction). After the first and second tilted implants are formed a second drain implant is formed in the substrate.

In another embodiment an EWL implant is formed such that it is offset from the gate edge of the select gate (such as through the use of an optional mask) and kept out of the center wordline. In yet another embodiment, an impurity such as phosphorus is implanted from impurity ions projected at a vertical angle and then diffused to obtain high enough concentrations under the edge wordline to mitigate erase pushout. The edge wordline implants lessen the impact of charge accumulation adjacent edge wordlines due to erase cycling.

BRIEF DESCRIPTION OF THE DRAWINGS

The invention, together with further advantages thereof, may best be understood by reference to the following description taken in conjunction with the accompanying drawings in which.

It should be noted that like reference numbers refer to like elements in the figures.

DETAILED DESCRIPTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

References within the specification to "one embodiment" or "an embodiment" are intended to indicate that a particular feature, structure, or characteristic described in connection with the embodiment is included in at least one embodiment of the present invention. The appearance of the phrase "in one embodiment" in various places within the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 2:
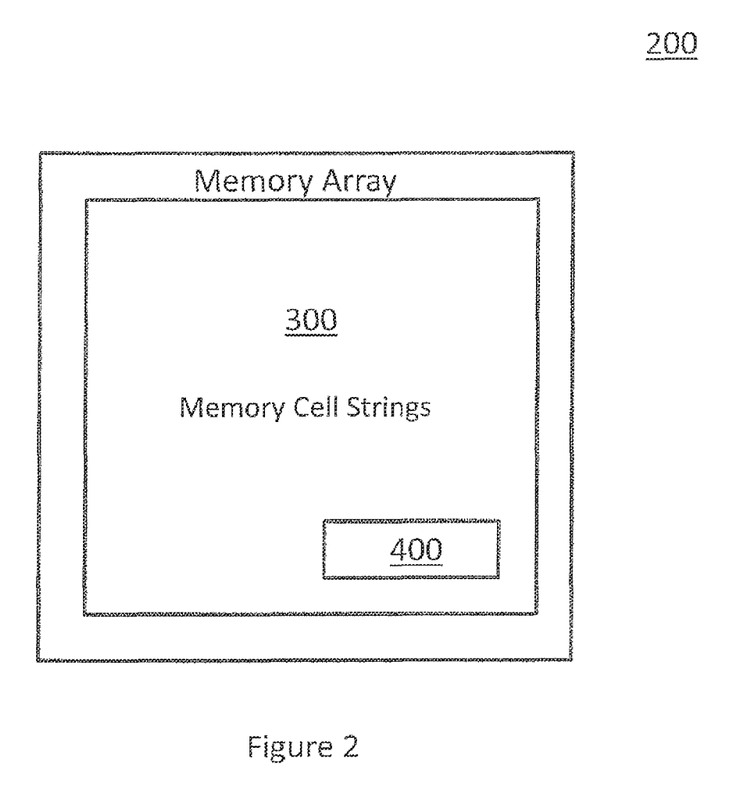
FIG. 2 shows an exemplary memory cell array with memory cell strings having memory cells that include tilted edge wordline implants according to one embodiment.

Exemplary Memory Cell Array with Memory Cell Strings having Memory Cells that include Edge Wordline Implants According to One Embodiment FIG. 2 shows an exemplary memory array 200 (the exemplary operating environment of exemplary edge memory cells) that comprises memory cell strings having edge memory cells that include edge wordline implants according to one embodiment. The edge wordline implants lessen the impact of charge accumulation adjacent edge wordlines due to erase cycling. One embodiment requires the use of a critical mask, another adds to noncritical masks, and a third does not require any additional masks. FIG. 2 shows memory array 200 and memory cell strings 300.

Figure 3:
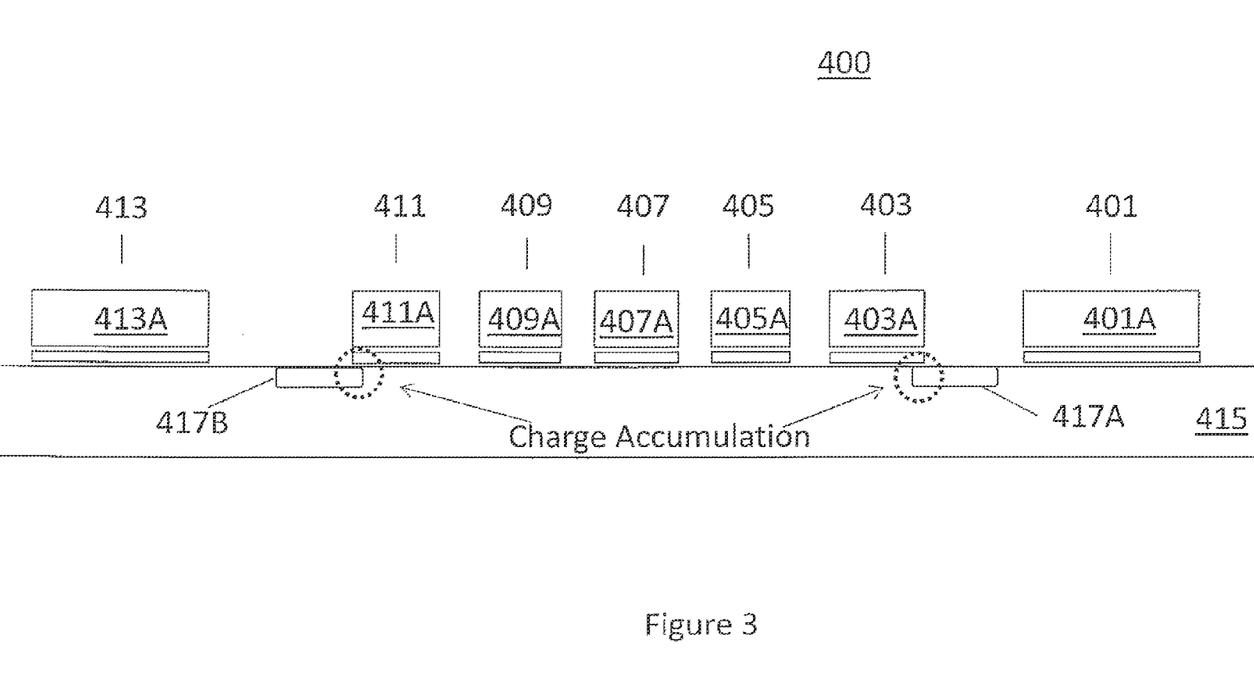
FIG. 3 shows a cross sectional view of a memory cell string according to one embodiment.

Referring to FIG. 2, memory array 200 includes an array of addressable memory cells that are configured to store data. In one embodiment, the memory cells are provided as a part of a plurality of memory cell strings 300 that are included in memory array 200. FIG. 3 shows a cross sectional view of a memory cell string 400 of memory cell strings 300 according to one embodiment. In one embodiment, memory cell string 400 is configured to include memory cell selecting devices 401 and 413 that comprise select gates 401A and 413A, edge memory cells 403 and 411 that comprise edge wordlines 403A and 411A and center memory cells 405, 407 and 409 that comprise center wordlines 405A, 407A and 409A. Edge wordline implants 417A and 417B are formed in substrate 415 adjacent edge wordlines 403A and 411A. In one embodiment, edge wordline implants 417A and 417B are formed using an implantation system that projects a beam of impurity ions at a tilt angle. In other embodiments, edge wordline implants 417A and 417B are formed using an implantation system that projects a beam of impurity ions at vertical angle. In one embodiment, edge wordline implants 417A and 417B are implanted such that the implant dopant (the impurity species) is not implanted in the regions adjacent center memory cells 405, 407 and 409. Moreover, in one embodiment, edge wordline implants 417A and 417B are implanted such that implant dopant is kept away from select gates 401A and 413A. The process of forming tilted edge wordline implants according to an exemplary embodiment is described herein in detail with reference to FIGS. 5A-5F below. The process of forming vertical edge wordline implants according to an exemplary embodiment is described herein in detail with reference to FIGS. 7 and 8. In one embodiment, edge wordline implants 417A and 417B are formed to partially extend underneath the layered stacks (comprising select gates and ONO material) that are formed above substrate 415 and form a part of edge memory cells 403 and 411. In one embodiment, forming edge wordline implants 417A and 417B in this manner, lessens the impact of charge that accumulates next to edge wordlines 403A and 411A (due to erase cycling) and operates to retard concomitant increases in memory cell threshold voltage, Vt, that can prevent the complete erasure of edge memory cells 403 and 411. In one embodiment, the width of edge wordlines 403A and 411A can be selected based on the implant dose of tilted edge wordline implants 417A and 417B and to ensure that the threshold voltage Vt of memory cells associated with edge wordlines 403A and 411A is the same as the threshold voltage Vt for memory cells associated with center wordlines 405A, 407A and 409A. In addition, in one embodiment, the width of edge wordlines 401A and 411A is chosen to mitigate potential short channel effects.

A solid-state-storage program-erase cycle is a sequence of events in which data is written to a solid-state flash memory cell (such as the type found in a so-called flash or thumb drive), then erased, and then rewritten. Program-erase (PE) cycling can serve as a criterion for quantifying the endurance of flash storage devices as such devices have an endurance of a limited number of PE cycles. In one embodiment, memory cells (including flash memory cells) formed as described herein to include edge wordline implants (e.g., 417A and 417B) as is discussed above exhibit improved endurance as compared to conventional memory cells.

Operation

Figure 4:
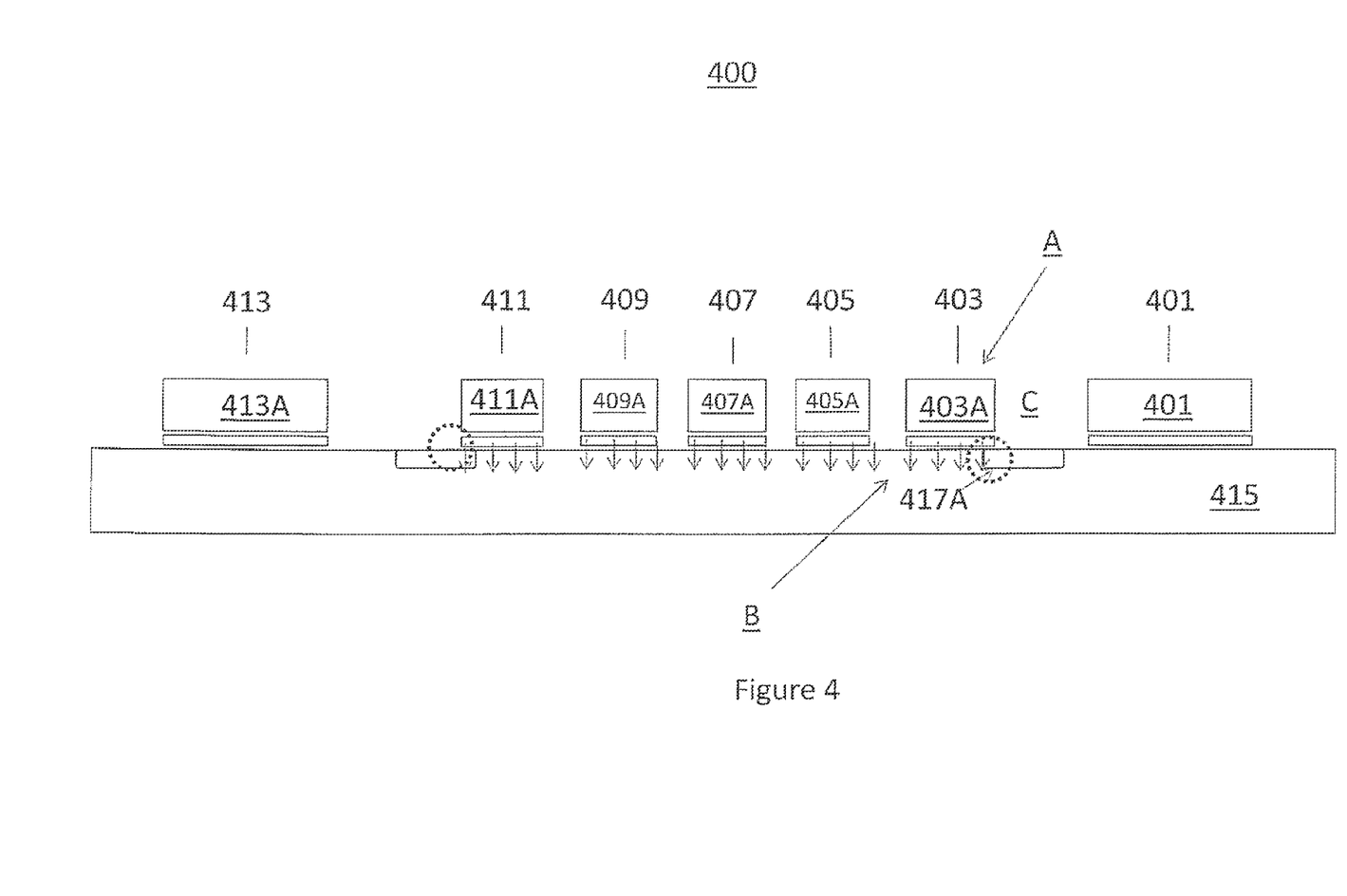
FIG. 4 illustrates an erase operation where voltages are applied to bit lines and wordlines to effect the erasure of memory cells according to one embodiment.

FIG. 4 illustrates an exemplary erase operation where predetermined voltage states are applied to terminals of edge memory cell 403 in order to effect the erasure of the memory cells. Referring to FIG. 4, in operation, during an erase cycle, as shown at A, predetermined voltage states are applied to the terminals of the memory cells (such as via wordline 403A, select gates 401A and 413A, substrate 415, adjacent memory cell 405, etc.) to effect the erasure of the memory cells. As shown at B, the application of the voltage states causes negative charge carriers to move from the charge storage layer across bottom oxide layer 403C into the substrate (see arrows). In one embodiment, edge wordline implant 417A, is formed to occupy space where charge accumulates during erase cycling, as is shown at C. In one embodiment, the resistance to threshold voltage increases provided by tilted edge wordline implants 417A and 417B enable a clean erasure of edge memory cells 403 and 411 with a standard threshold voltage well beyond the cycling limits of some conventional memory cells. Moreover, tilted edge wordline implants 417A and 417B operate to reduce the edge wordline degradation caused by charge accumulation and improve Vboost for program inhibit operations.

Process Flow for Forming Edge Wordline Implants Adjacent Edge Wordlines According to One Embodiment

First Exemplary Embodiment

FIGS. 5A-5F show a series of memory cell cross sections illustrating a process flow that is used to form tilted edge wordline implants in a memory cell string according to one embodiment of the invention. Although specific operations are discussed with reference to the cross sections, such operations are exemplary. That is embodiments of the present invention are well suited to include the performance of various other operations or variations of the operations discussed with reference to the memory cell cross sections.

Figure 5A:
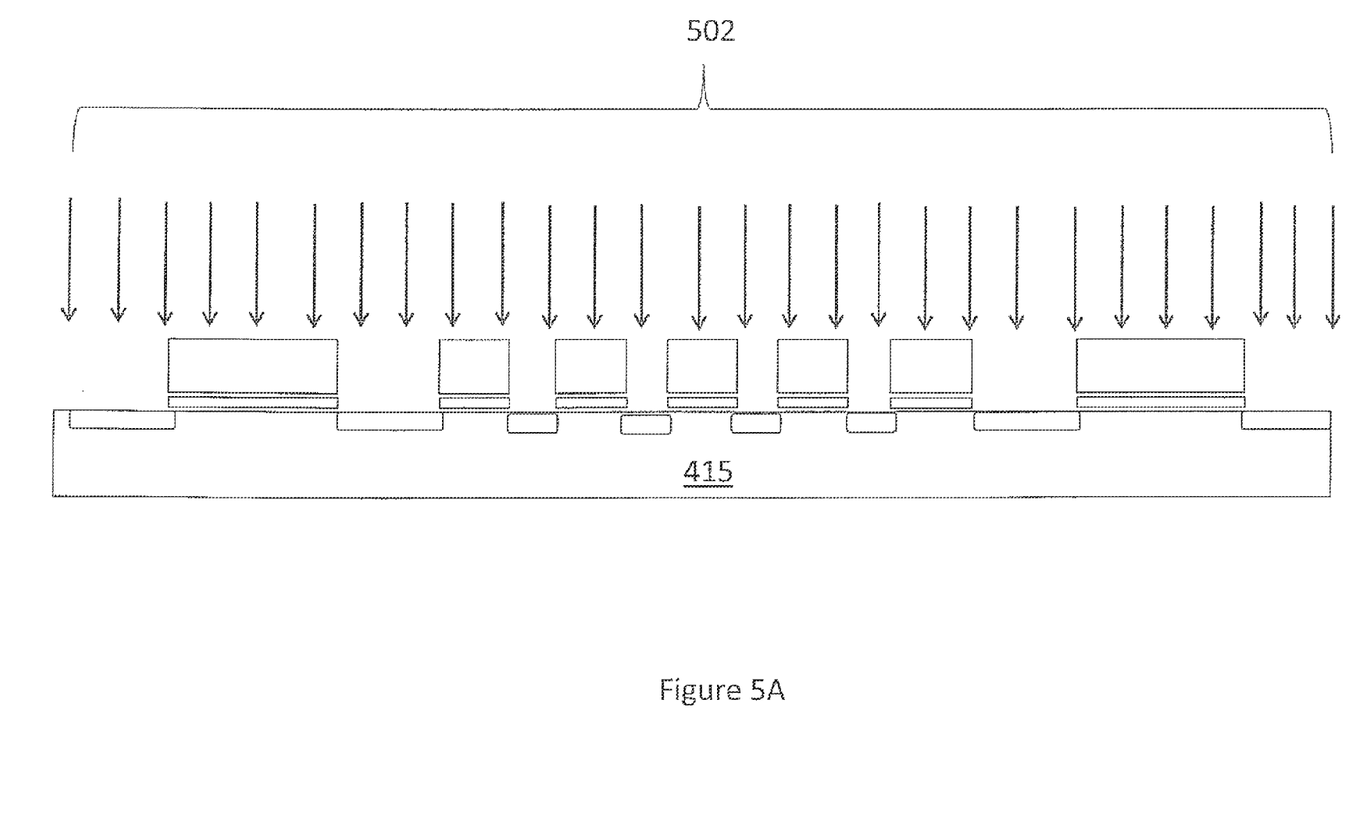
FIG. 5A shows a memory cell cross section illustrating a part of a process for forming tilted edge wordline implants according to one embodiment.

Referring to FIG. 5A, in an initial implantation operation, a vertical drain implant 502, MDD1 (a first drain implant) is formed in substrate 415 between the structures (comprising select gates or wordlines and ONO material) that are formed above the surface of substrate 415 (and that form implant windows). In one embodiment, the vertical implant can be a low dose implant that is formed without the use of masks or spacers (see FIG. 5A).

Figure 5B:
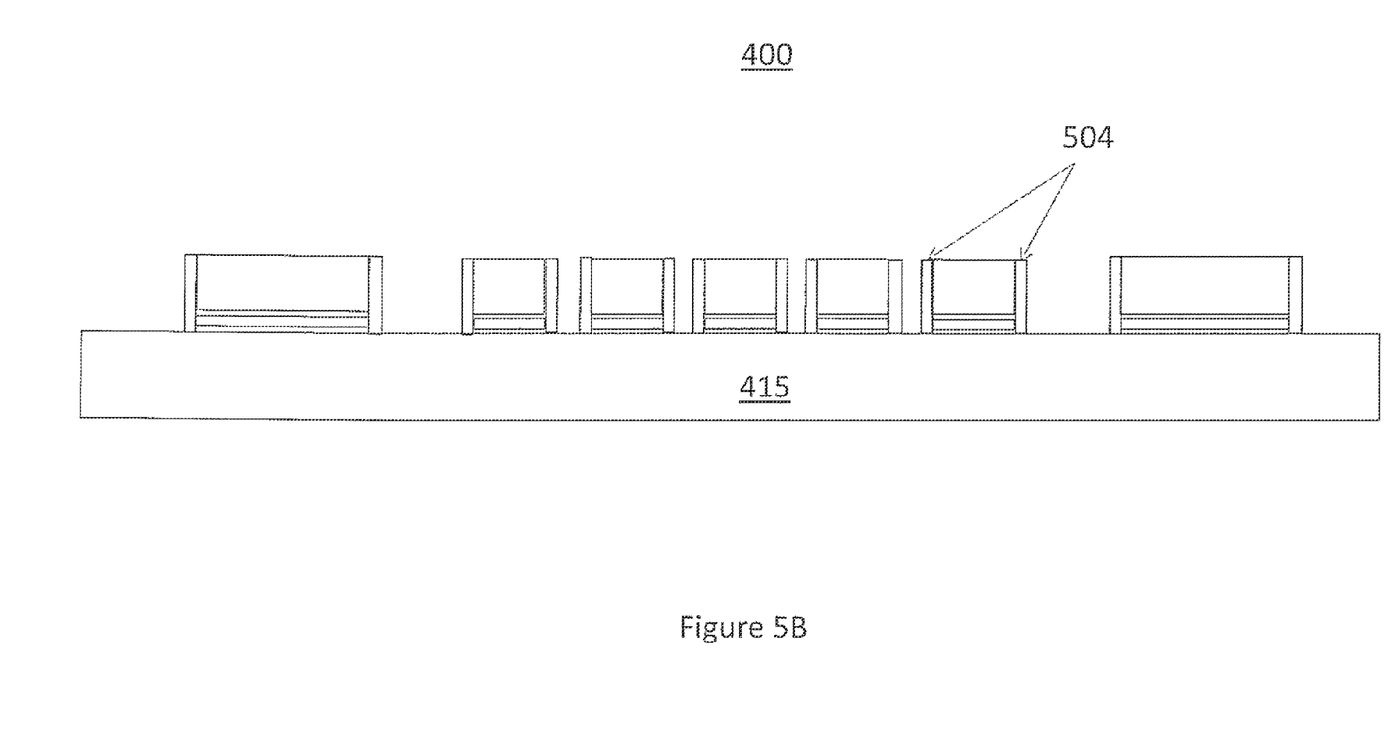
FIG. 5B shows a memory cell cross section illustrating a part of a process for forming tilted edge wordline implants according to one embodiment.

Referring to FIG. 5B, subsequent to the execution of one or more operations that provide the result shown in FIG. 5A, an EWL (edge word line) spacer 504 is formed on both sides of all wordlines in the memory cell string 400.

Figure 5C:
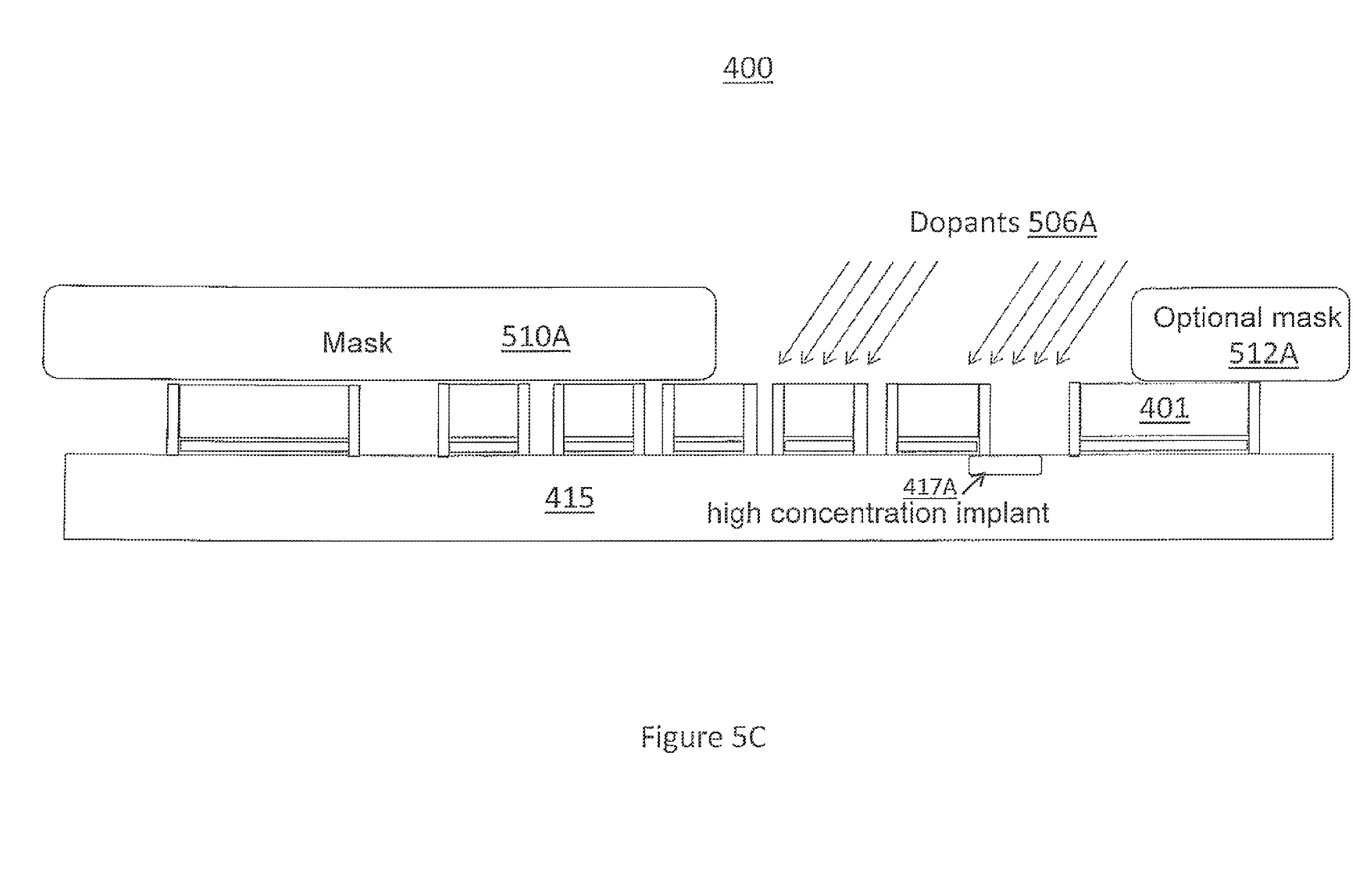
FIG. 5C shows a memory cell cross section illustrating a part of a process for forming tilted edge wordline implants according to one embodiment.

Referring to FIG. 5C, subsequent to the execution of one or more operations that provide the result shown in FIG. 5B, a first EWL implant 417A is formed in substrate 415 (such as from dopants 506A which can be projected from an ion implantation system) adjacent to, and extending partially underneath, edge wordline 403A. In one embodiment, first EWL implant 417A is delivered to substrate 415 from a tilt angle. The tilt angle ensures the implantation of EWL implant 417A away from the edge of select gate 401A (see FIG. 5C). In one embodiment, the implant dose can be much heavier than the dose that is used in the formation of MDD1 502. Referring again to FIG. 5C, in one embodiment, a mask 510A covering one half of memory cell string 400 can be used in the formation of first EWL implant 417A. Moreover, an optional mask 512A that covers a portion of select gate 401A can be used.

Figure 5D:
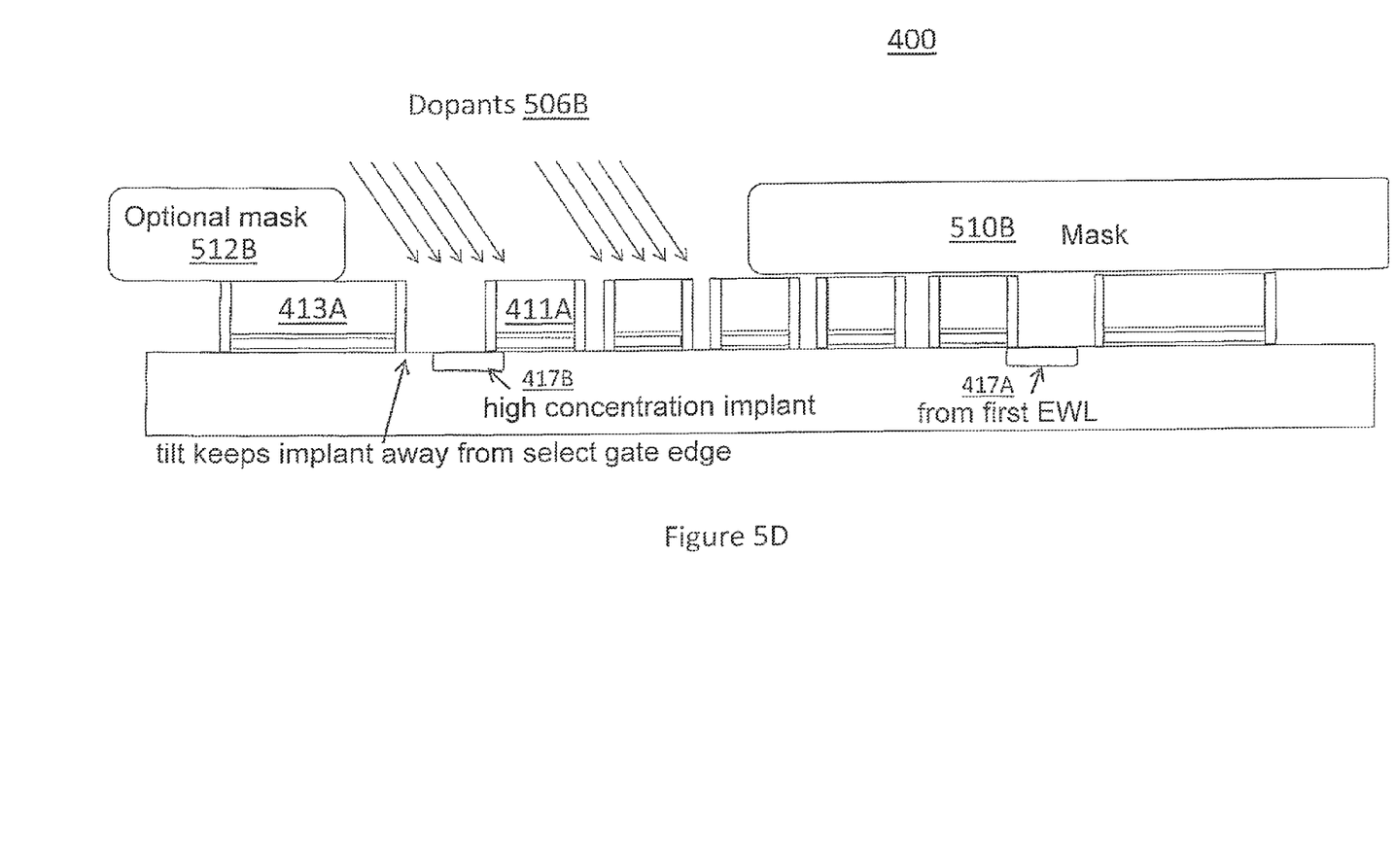
FIG. 5D shows a memory cell cross section illustrating a part of a process for forming tilted edge wordline implants according to one embodiment.

Referring to FIG. 5D, subsequent to the execution of one or more operations that provide the result shown in FIG. 5C, a second EWL implant 417B is formed in substrate 415 (such as from dopants 506B which can be projected from an ion implantation system) adjacent to, and extending partially underneath, edge wordline 411A. In one embodiment, second EWL implant 417B is delivered to substrate 415 from a tilt angle. The tilt angle ensures the implantation of EWL implant 417B away from the edge of select gate 413A (see FIG. 5D). In one embodiment, the implant dose can be much heavier than the dose that is used in the formation of MDD1 502. Referring again to FIG. 5D, in one embodiment, a mask 510B covering one half of memory cell string 400 can be used in the formation of second EWL implant 417B. Moreover, an optional mask 512B that covers a portion of select gate 413A can be used.

Figure 5E:
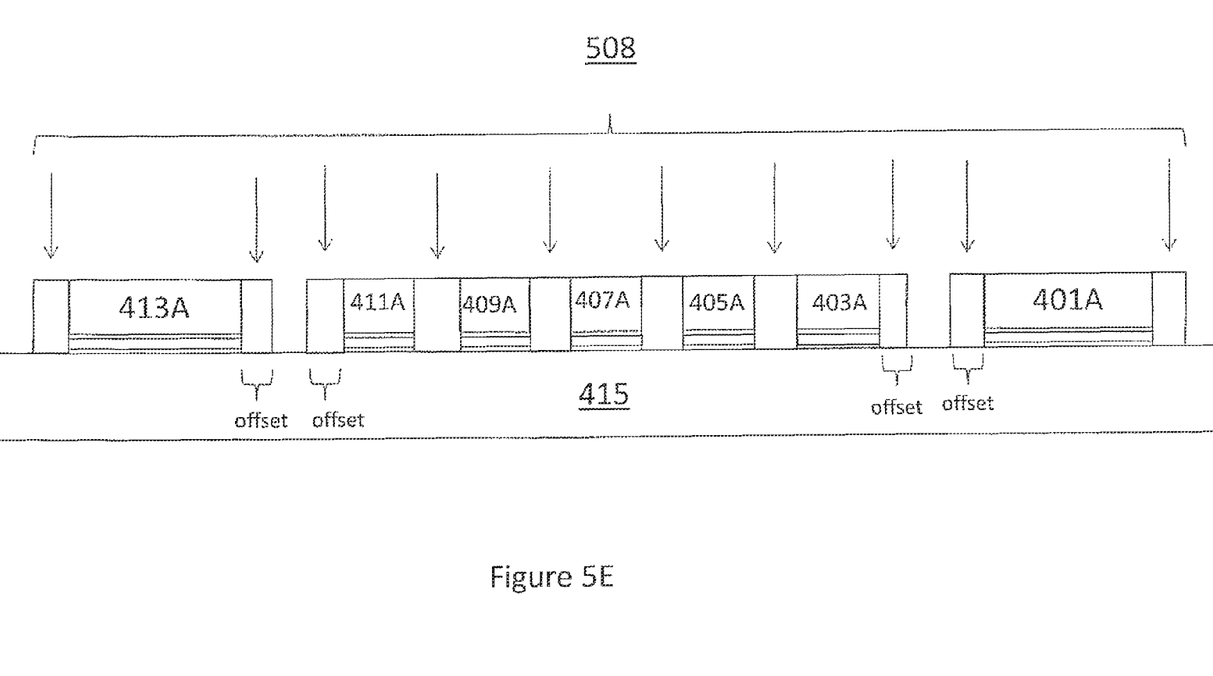
FIG. 5E shows a memory cell cross section illustrating a part of a process for forming tilted edge wordline implants according to one embodiment.

Referring to FIG. 5E, subsequent to the execution of one or more operations that provide the result shown in FIG. 5D, a second spacer 508 is formed that fills the spaces between the center wordlines and thickens the spacers 504 between the select gates and edge wordlines (between 401A and 403A and between 413A and 411A). Accordingly, the offset from the edges of the select gates and the edge wordlines to the edges of the respective spacers, formed adjacent the select gates and the edge wordlines, is increased (see FIG. 5E).

Figure 5F:
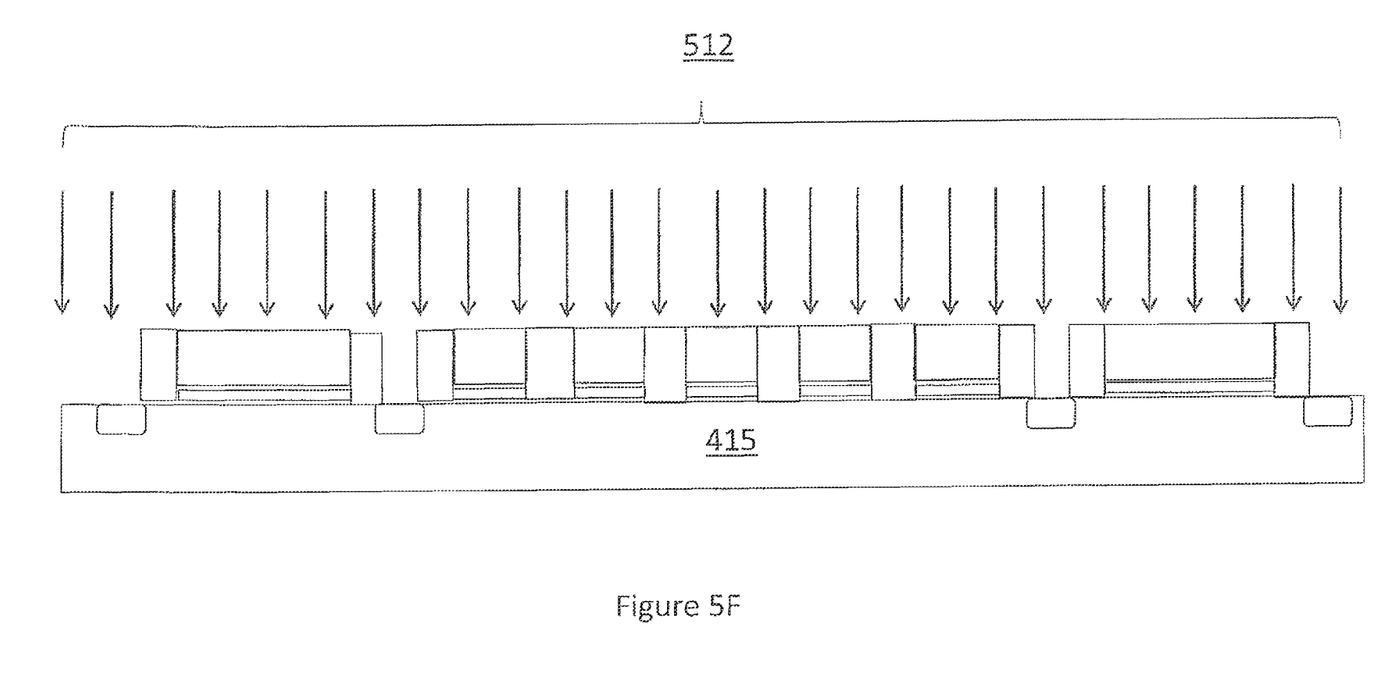
FIG. 5F shows a memory cell cross section illustrating a part of a process for forming tilted edge wordline implants according to one embodiment.

Referring to FIG. 5F, subsequent to the execution of one or more operations that provide the result shown in FIG. 5E, a vertical drain implant, MDD2 512 is formed in substrate 415. In one embodiment, MDD2 510 is an implant of higher dose than is first drain implant MDD1 502 and is formed without a mask. In one embodiment, impurity species that can be used in the formation of vertical drain implant MDD2 510 can include but is not limited to As and P. In one embodiment, a P implant can be used to grade the bottom of the junction.

In one embodiment, the optimization of select gate (e.g., 401 and 413) and edge wordline (e.g., 403 and 411) junctions is decoupled. Such decoupling allows each junction to be optimized independently for its specific function. For example, in one embodiment, the select gate junctions can be optimized to minimize GIDL by controlling the conditions of the MDD2 implant, for example, e.g., adjusting the dopant species (e.g., phosphorus or other dopant), energy or dose. In one embodiment, an additional implant into the select gate junction alone can be formed for purposes of optimizing that junction. And of course, the edge wordline junction can be optimized, as discussed above, to minimize its degradation.

In one embodiment, the herein described tilted edge wordline implants (e.g., 417A and 417B) are formed next to edge wordlines (e.g., 403A and 411A) and away from the adjacent select gates (e.g., 401A and 413A). In one embodiment, the dopant can be arsenic. In other embodiments, the dopant can be an impurity species other than arsenic. In one embodiment, tilting the implant toward the edge wordlines (e.g., 403A and 411A) places more dopant where charge accumulates during erase cycling. As described herein, implanting the dopant in this manner reduces degradation caused by charge accumulation. Tilting the implant also keeps dopant out of the space between the center cells so that they are not affected. Short channel effects of the edge wordlines (e.g., 403A and 411A) can be mitigated by increasing the width of the edge wordlines (e.g., 403A and 411A). A process option is to mask half of the cell string during implantation of each of the EWL implants (e.g., 417A and 417B). The tilt angle directs dopant toward the edge wordlines (e.g., 403A and 411A) and away from the select gates (e.g., 401A and 413A). This can help to avoid increases in gate induced leakage at the select gates. The EWL implants (e.g., 417A and 417B) can be formed at the same time as drain implant MDD1 or, can be formed after the formation of a spacer (e.g., 504) whose width can be adjusted to maximize effect. And, parameters of the EWL implants (e.g., 417A and 417B) such as tilt, energy, dose and species can be varied.

Second Exemplary Embodiment

Figure 6:
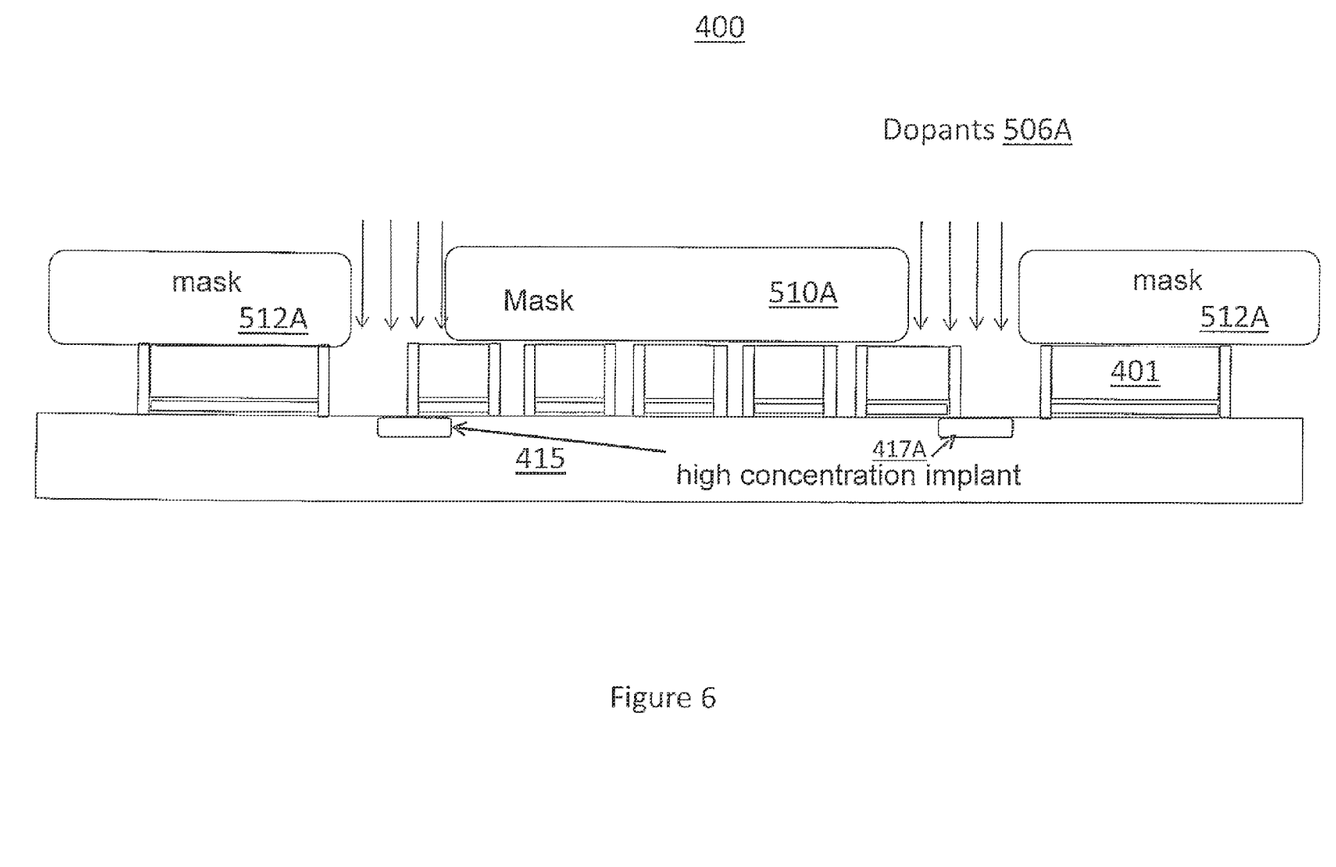
FIG. 6 shows an operation in a process for forming edge wordline implants according to one embodiment.

FIG. 6 shows a memory cell cross section illustrating a part of a process flow that is used to form vertical edge wordline implants in a memory cell string according to one embodiment of the invention.

Referring to FIG. 6, an EWL implant is formed such that it is offset from the gate edge of the select gate (such as through the use of an optional mask) and kept out of the center wordline. In one embodiment, a mask is used to split the space between the select gate and the edge wordline to keep the implant away from the select gate and to split the edge wordline to keep the implant out of the center wordlines. In one embodiment, the implants can be vertical. Vertical implants can be advantageous as they can be used to avoid implantation of impurities into the ONO layers. Implantation of impurities into the ONO layers can damage the ONO layers and result in reliability problems. Moreover, in one embodiment, the masking that is used can allow the use of a higher implant dose and smaller spacers.

Third Exemplary Embodiment

Figure 7:
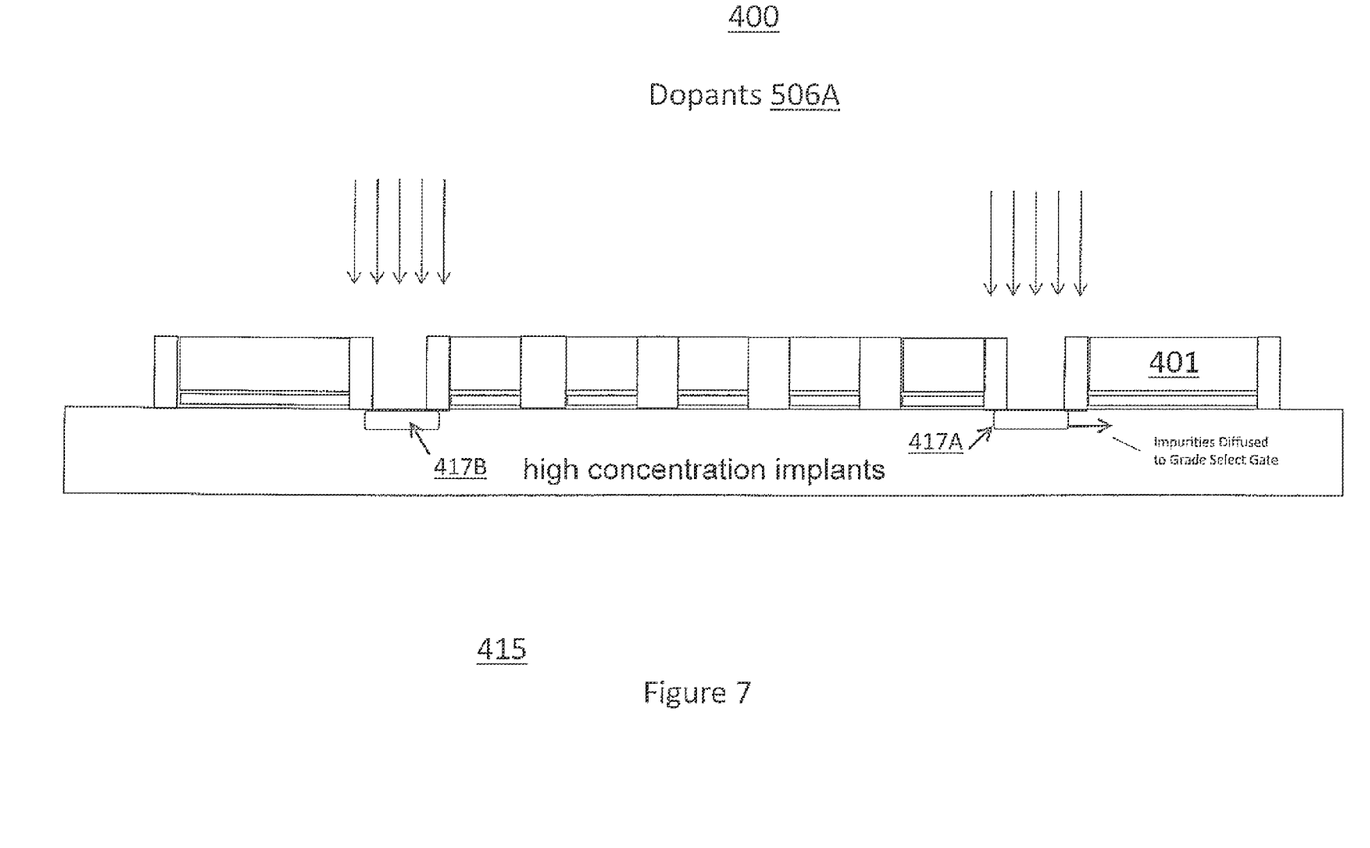
FIG. 7 shows an operation in a process for forming edge wordline implants according to one embodiment.

Referring to FIG. 7, an impurity such as phosphorus is implanted from impurity ions projected at a vertical angle and then diffused to obtain high enough concentrations under the edge wordline to mitigate erase pushout. In the FIG. 7 embodiment, EWL implant 417A is formed without the use of a mask. In one embodiment, spacers that close the areas between wordlines are used (see FIG. 7). In one embodiment, the diffusion of the phosphorus grades the select gate sufficiently to control GIDL. Accordingly, in this embodiment, the edge wordlines and the select gate junctions are optimized concurrently.

Flowchart of Process for Forming Edge Wordline Implants Adjacent Edge Wordlines

Figure 8:
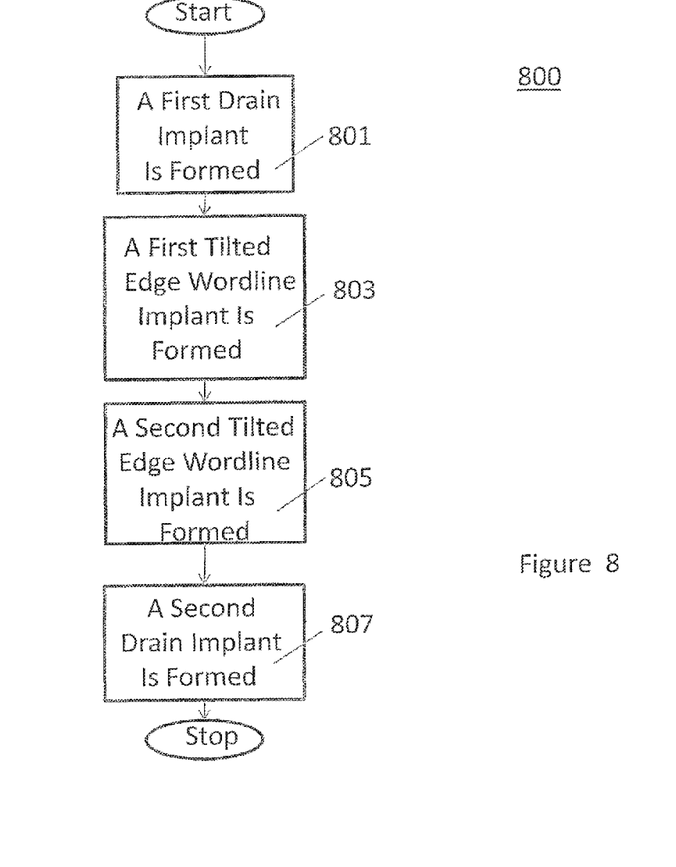
FIG. 8 shows a flowchart of a method for forming tilted edge wordline implants according to one embodiment.

FIG. 8 shows a flowchart 800 of a process for forming edge wordline implants adjacent edge wordlines according to one embodiment. Although specific steps are disclosed in the flowchart, such steps are exemplary. That is the present invention is well suited to performing various other steps or variations of the steps recited in the flowchart.

Referring to FIG. 8, at 801 a first drain implant (MDD1) is formed in the substrate between structures formed on the substrate (select gates and wordlines). In one embodiment, the first drain implant is of a lower dose than a subsequent drain implant.

At 803, a first EWL implant is implanted into the substrate adjacent to, and extending underneath, a first edge wordline (e.g., 403A in FIG. 3).

At 805, a second EWL implant is formed in the substrate adjacent to, and extending underneath, a second edge wordline (e.g., 411A in FIG. 3).

At 807, a second drain implant (MDD2) is formed in the substrate between structures formed on the substrate (select gates and wordlines). In one embodiment, the second drain implant is an implant of higher dose than the first drain implant. In one embodiment, the operations 801-807 can be performed as a part of the fabrication of a flash memory cell array with memory cells that include an ONO layer. In other embodiments, operations 801-807 can be part of the fabrication of other types of memory cell arrays.

In one embodiment, with regard to process 800, where tilted implants are employed, a mask such as is shown in FIGS. 5A-5F can be used in the formation of the implants. However, in another embodiment, where vertical implants are employed, a mask such as is shown in FIG. 6 can be used to split the space between the select gate and the edge wordline in order to keep the implant away from the select gate and to split the edge wordline to in order to keep the implant out of the center wordlines. In one embodiment, with regard to process 800, because a mask is not used, there may not be a need for first and second implantations operations, e.g., 803 and 805 of FIG. 8 (see FIG. 7). In one embodiment, with regard to process 800, for EWL implants, an impurity such as phosphorus can be implanted and diffused to obtain sufficiently high level concentrations of impurities under the edge wordline to mitigate erase pushout. However, in other embodiments, such as is illustrated in FIGS. 5A-5F the EWL implants may not be diffused.

With regard to exemplary embodiments thereof, a process for forming tilted edge wordline implants is disclosed. The process includes forming a first drain implant in a substrate, forming a first tilted implant in a substrate adjacent a first edge wordline to supplement the first drain implant, where the first tilted implant is provided at a tilt angle from a first direction, and forming a second tilted implant in the substrate adjacent a second edge wordline to supplement another first drain implant, where the second tilted implant is provided at a tilt angle from a second direction. Thereafter, a second drain implant is formed in the substrate.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

We claim:

1. A method of forming tilted edge wordline implants comprising:
   forming a first drain implant in a substrate;
   forming a first tilted implant in the substrate between a first edge wordline and a first select gate adjacent to the first edge wordline to supplement the first drain implant, wherein the first tilted implant is provided at a tilt angle from a first direction to deliver the first tilted implant partially underneath the first edge wordline and not underneath the first select gate and intermediate wordlines;
   forming a second tilted implant in the substrate between a second edge wordline and a second select gate adjacent to the second edge wordline to supplement the first drain implant, wherein the second tilted implant is provided at a tilt angle from a second direction to deliver the second tilted implant partially underneath the second edge wordline and not underneath the second select gate and the intermediate wordlines, wherein a memory cell string comprises the first edge wordline, the first select gate, the second edge wordline, the second select gate, and the intermediate wordlines; and
   forming a second drain implant partially within the first drain implant in the substrate.

2. The method of claim 1 wherein a width of the first edge wordline and the second edge wordline is based respectively on a dose of the first tilted implant and the second tilted implant and establishes a threshold voltage of transistors associated with the first edge wordline and the second edge wordline as equivalent to that of the intermediate wordlines.

3. The method of claim 1 wherein the first tilted implant is formed after a spacer is formed.

4. The method of claim 1 wherein a tilt of the first tilted implant is adjustable and is sufficiently large to keep the tilted implant away from the intermediate wordlines of the memory cell string.

5. The method of claim 1 wherein the first tilted implant and the second tilted implant are diffused subsequent to being implanted.

6. The method of claim 1 wherein the first and the second tilted implant are prevented from implantation adjacent the first select gate and a second select gate.

7. The method of claim 1 wherein half of the memory cell string is masked during the formation of the first tilted implant and the second tilted implant.

8. The method of claim 1 wherein the first drain implant and the second drain implant are formed without use of a mask.

9. The method of claim 1 wherein the second drain implant has a higher dose than the first drain implant.

10. The method of claim 1 further comprising:
forming an additional tilted implant in a direction opposite the first tilted implant adjacent the first select gate; and
forming an additional tilted implant in a direction opposite the second tilted implant adjacent the second select gate.

11. A method of forming a memory array comprising:
forming a plurality of memory cell strings comprising a plurality o f memory cell selecting devices and a plurality of memory cells, wherein the plurality of memory cells comprise edge wordlines with tilted edge wordline implants;
forming the tilted edge wordline implants, wherein forming the tilted edge wordline implants comprises:
forming a first drain implant in a substrate;
forming a first tilted implant in the substrate between a first edge wordline and a first select gate adjacent to the first edge wordline to supplement the first drain implant, wherein the first tilted implant is provided at a tilt angle from a first direction to deliver the first tilted implant partially underneath the first edge wordline and not underneath the first select gate and intermediate wordlines;
forming a second tilted implant in the substrate between a second edge wordline and a second select gate adjacent to the second edge wordline to supplement the first drain implant, wherein the second tilted implant is provided at a tilt angle from a second direction to deliver the second tilted implant partially underneath the second edge wordline and not underneath the second select gate and the intermediate wordlines, wherein a memory cell string of the plurality of memory cell strings comprises the first edge wordline, the first select gate, the second edge wordline, the second select gate, and the intermediate wordlines; and
forming a second drain implant partially within the first drain implant in the substrate.

12. The method of claim 11 wherein a width of the first edge wordline and the second edge wordline is based respectively on a dose of the first tilted implant and the second tilted implant and establishes a threshold voltage of transistors associated with the first edge wordline and the second edge wordline as equivalent to that of the intermediate wordlines.

13. The method of claim 11 wherein the first tilted implant and the second tilted implant are diffused after being implanted.

14. The method of claim 11 wherein the first and the second tilted implant are prevented from implantation adjacent the first select gate and a second select gate.

15. The method of claim 11 wherein half of the memory cell string of the plurality of memory cell strings is masked during the formation of the first tilted implant and the second tilted implant.

16. The method of claim 11 wherein the first drain implant and the second drain implant are formed without use of a mask.

17. The method of claim 11 wherein the second drain implant has a higher dose than the first drain implant.

18. A method for forming a flash memory device comprising:
forming a flash memory array comprising a plurality of memory cell strings;
forming the plurality of memory cell strings comprising a plurality of memory cell selecting devices and a plurality of memory cells, wherein the plurality of memory cells comprise edge wordlines with tilted edge wordline implants, wherein forming the tilted edge wordline implants comprises:
forming a lower silicon oxide layer, silicon nitride layer, and upper silicon oxide layer (ONO layer) on a substrate;
forming a first drain implant in the substrate;
forming a first tilted implant in the substrate between a first edge wordline and a first select gate adjacent to the first edge wordline to supplement the first drain implant, wherein the first tilted implant is provided at a tilt angle from a first direction to deliver the first tilted implant partially underneath the first edge wordline and not underneath the first select gate and intermediate wordlines;
forming a second tilted implant in the substrate between a second edge wordline and a second select gate adjacent to the second edge wordline to supplement the first drain implant, wherein the second tilted implant is provided at a tilt angle from a second direction to deliver the second tilted implant partially underneath the second edge wordline and not underneath the second select gate and the intermediate wordlines, wherein a memory cell string of the plurality of memory cell strings comprises the first select gate, the second edge wordline, the second select gate, and the intermediate wordlines are comprised by a memory cell string of the plurality of memory cells strings; and
forming a second drain implant partially within the first drain implant in the substrate.

* * * * *